(12) United States Patent
Mattsson et al.

(10) Patent No.: US 6,933,773 B2
(45) Date of Patent: Aug. 23, 2005

(54) INTEGRATED CIRCUIT

(75) Inventors: Ulf Mattsson, Reading (GB); Gordon Wilson, Swindon (GB)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/673,566

(22) Filed: Sep. 30, 2003

(65) Prior Publication Data

US 2005/0077956 A1  Apr. 14, 2005

(30) Foreign Application Priority Data

Oct. 1, 2002 (GB) .................................. 0222781

(51) Int. Cl.[7] .............................................. G06G 7/12
(52) U.S. Cl. .................................... 327/560; 327/530
(58) Field of Search ............................... 327/530, 534, 327/535, 538, 540, 543, 560, 561, 562, 563

(56) References Cited

U.S. PATENT DOCUMENTS

| | | |
|---|---|---|
| 4,388,539 A | 6/1983 | Boeke |
| 4,555,673 A | 11/1985 | Huijsing et al. |
| 5,220,272 A | 6/1993 | Nelson |
| 5,365,193 A | 11/1994 | Zuffada et al. |
| 5,384,548 A | 1/1995 | Sakurai et al. |
| 5,912,589 A | 6/1999 | Khoury et al. |
| 5,994,926 A | 11/1999 | Siniscalchi et al. |
| 5,999,055 A | 12/1999 | Kimura |
| 6,023,196 A | 2/2000 | Ashby et al. |
| 6,124,738 A * | 9/2000 | Iga ............................ 327/89 |
| 6,181,170 B1 * | 1/2001 | Koifman ..................... 327/108 |
| 6,219,261 B1 | 4/2001 | Stochino |
| 6,304,135 B1 | 10/2001 | Muza |

FOREIGN PATENT DOCUMENTS

| | | |
|---|---|---|
| EP | 0 561 099 A1 | 9/1983 |
| EP | 0 627 813 A1 | 12/1994 |
| EP | 0 766 385 A2 | 4/1997 |
| GB | 1 421 093 | 1/1976 |
| WO | WO 01/63754 A1 | 8/2001 |

* cited by examiner

Primary Examiner—Jeffrey Zweizig
(74) Attorney, Agent, or Firm—Burns, Doane, Swecker & Mathis, LLP

(57) ABSTRACT

An integrated circuit comprises a biasing circuit for maintaining the transconductance of a Gm cell constant. The integrated circuit comprises an on-chip constant voltage source and an on-chip constant current source. The on-chip constant current source has a connection for an external resistance, the value of the external resistance determining the current generated by the constant current source. The biasing circuit comprises means for providing a first fraction ($\beta$) of the current generated by the on-chip current source to bias the output of the Gm cell, and means for providing a second fraction ($\alpha$) of the voltage generated by the on-chip voltage source to bias the input of the Gm cell. The transconductance of the Gm cell is controlled to be equal to the ratio of said fraction of the current generated by the on-chip current source to said fraction of the voltage generated by the on-chip voltage source.

28 Claims, 7 Drawing Sheets

INTEGRATED CIRCUIT

This application claims priority under 35 U.S.C. §§ 119 and/or 365 to Application No. 0222781.7 filed in the United Kingdom on Oct. 1, 2002; the entire content of which is hereby incorporated by reference.

FIELD OF THE INVENTION

The invention relates to an integrated circuit, and in particular, to an integrated circuit having a biasing circuit for maintaining the transconductance of a Gm cell constant.

BACKGROUND OF THE INVENTION

The transconductance (Gm) of a cell is defined as the ratio of the output current $I_{OUT}$ to the input voltage VIN. The transconductance of a Gm cell on an integrated circuit varies over process and temperature. Depending on the on-chip components used for the cell, this variation can be greater than ±30%.

This variation is unacceptable for integrated circuits which rely on a constant transconductance. For example, a constant transconductance is required in order to keep the gain constant in low noise amplifiers (LNAs) having inductive collector loads, or to minimise the variation in the start up gain of a voltage controlled oscillator (VCO). In another example, a constant transconductance is required to minimise frequency error in a constant GmC-filter, such that the variation in the frequency characteristic of the filter frequency is reduced to that due to variation in the capacitors. The variations in capacitance values are usually small compared to the variations in transconductance.

In GmC-filters and gyrator-C circuits, it is known to use an "autotuner" for controlling the tuning frequency of the filter.

These circuits use a secondary filter or oscillator using a similar Gm C cell within a control loop, where the frequency of the filter is compared with an external frequency reference to generate an error signal. GB1,421,093 is an example of a GmC-filter having an external frequency reference. U.S. Pat. No. 6,304,135 is another example, in which the GmC-filter uses an external resistor for controlling the frequency. U.S. Pat. No. 4,388,539 discloses a constant Gm circuit which, as above, has the disadvantage of requiring the use of a dedicated external resistor for maintaining the transconductance constant.

Thus, all of the known solutions have the disadvantage of requiring an extra external frequency reference or a dedicated external resistor to achieve a constant transconductance, the external frequency reference or resistor being used to fine tune the filter response. The need for an external frequency reference or resistor also has the disadvantage of requiring one or more extra pins on the integrated circuit.

The aim of the present invention is to provide an integrated circuit having a constant Gm biasing circuit which does not have the disadvantages mentioned above.

SUMMARY OF THE INVENTION

According to a first aspect of the invention, there is provided an integrated circuit comprising a biasing circuit for maintaining the transconductance of a Gm cell constant, the integrated circuit comprising an on-chip constant voltage source and an on-chip constant current source, the on-chip constant current source having a connection for an external resistance, the value of the external resistance determining the current generated by the constant current source, characterised in that the biasing circuit comprises:

means for providing a first fraction (β) of the current generated by the on-chip current source to bias the output of the Gm cell;

means for providing a second fraction (α) of the voltage generated by the on-chip voltage source to bias the input of the Gm cell; and means for controlling the transconductance of the Gm cell to be equal to the ratio of said fraction of the current generated by the on-chip current source to said fraction of the voltage generated by the on-chip voltage source.

According to another aspect of the invention, there is provided a method of maintaining the transconductance of a Gm cell on an integrated circuit constant, the integrated circuit comprising an on-chip constant voltage source and an on-chip constant current source, the on-chip constant current source having a connection for an external resistance, the value of the external resistance determining the current generated by the constant current source, characterised in that the method comprises the steps of:

providing a first fraction (β) of the current generated by the on-chip current source to bias the output of the Gm cell;

providing a second fraction (α) of the voltage generated by the on-chip voltage source to bias the input of the Gm cell; and controlling the transconductance of the Gm cell to be equal to the ratio of said fraction of the current generated by the on-chip current source to said fraction of the voltage generated by the on-chip voltage source.

The invention has the advantage that it does not require the use of an external frequency reference, an extra external resistor or any extra external pins.

BRIEF DESCRIPTION OF THE DRAWINGS

For a better understanding of the invention, and to show more clearly how it may be carried into effect, reference will now be made, by way of example, to the accompanying drawings in which:—

DETAILED DESCRIPTION OF A PREFERRED EMBODIMENT OF THE PRESENT INVENTION

Figure 1:
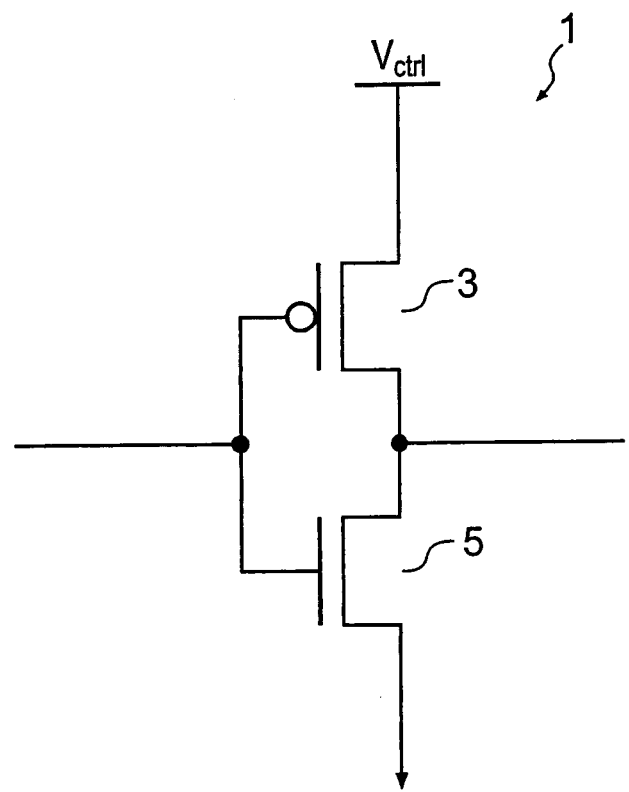
FIG. 1 shows a typical Gm cell.

FIG. 1 shows a typical Gm cell 1, namely a CMOS inverter comprising first and second transistors 3, 5. The transconductance of such a Gm cell 1 is controlled by controlling the total voltage $V_{ctrl}$ applied across the Gm cell 1.

Figure 2:
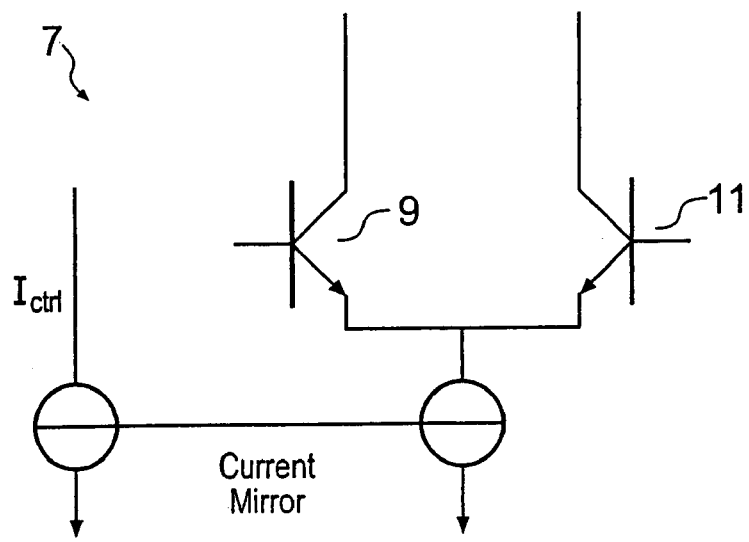
FIG. 2 shows another example of a typical Gm cell.

FIG. 2 shows another common type of Gm cell 7, namely a bipolar differential pair configuration comprising transistors 9, 11. The transconductance of the bipolar differential pair configuration 7 is controlled by controlling the bias current $I_{ctrl}$.

Reference will now be made to how the transconductance of a Gm cell, for example a Gm-cell 1, 7 as shown in FIG. 1 or 2, is maintained constant in accordance with the invention. It is noted that FIGS. 1 and 2 give examples of transconductance amplifiers in their simplest forms, and the invention can be applied to any transconductance circuit arrangement, which has means of controlling its transconductance by means of a control voltage or control current.

Figure 3:
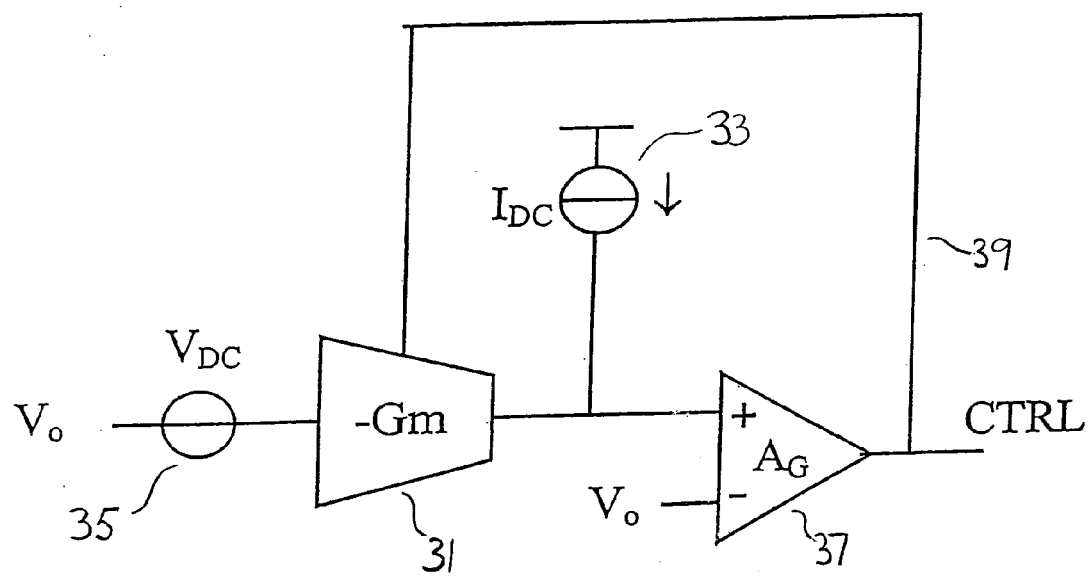
FIG. 3 shows a block diagram of a constant Gm biasing circuit according to the present invention.

FIG. 3 shows a block diagram of a circuit according to the present invention in which the transconductance of a Gm cell 31 is to be controlled. The constant Gm biasing circuit comprises a constant current source 33, a constant voltage source 35 and an amplifier 37 for introducing loop gain. A voltage $V_o$ is applied to the inverting input of the amplifier 37 to define the quiescent operating point voltage for the Gm cell 31. If $V_o$ is applied to the Gm cell 31 no current will flow at the output terminal, and the cell is biased in its quiescent state.

According to the invention, the current $I_{DC}$ provided by the constant current source 33 is a fraction of the current from an on-chip current source which is provided on the integrated circuit for other purposes, for example biasing the chip. Furthermore, the voltage $V_{DC}$ provided by the constant voltage source 35 is a fraction of the voltage of an on-chip voltage source which is also provided on the integrated circuit for other purposes.

As indicated above, the on-chip constant current source 33 and on-chip constant voltage source 35 are already provided on the integrated circuit for other purposes, for example: setting the input and output DC and signal levels to meet chip to chip interface specifications, eg LVDS and CML output levels; biasing analogue to digital (ADC) and digital to analogue (DAC) converters; or, monitoring of input signal levels or power levels in receiver circuits.

The invention has the advantage of enabling the transconductance to be controlled without the need for any external components provided specifically for this purpose.

To achieve a constant transconductance over a range of temperature and processes, the on-chip Gm cell 31 requires a means of control, either by applying a voltage or current, depending on the type of Gm cell being controlled (i.e. a control voltage for a Gm cell 1 as shown in FIG. 1, or a control current for a Gm cell 7 as shown in FIG. 2). The constant Gm biasing circuit ideally provides a control voltage or current (CTRL) to the on-chip Gm cells to keep their transconductance constant over process and temperature variations.

The transconductance is maintained constant by forcing the transconductance of the Gm cell 31 to be equal to $I_{DC}/V_{DC}$. This is achieved by controlling the Gm cell's control signal 39 in a loop configuration. As mentioned above, the control signal may be either a control current or a control voltage.

The accuracy of the transconductance of the Gm cell 31 of FIG. 3 is determined by the accuracies of the constant current source 33 ($I_{DC}$) and the constant voltage source 35 ($V_{DC}$). As mentioned above, the constant current source 33 and the constant voltage source 35 are derived from the respective constant current and constant voltage provided on-chip. Reference will now be made to how the constant current source 33 and constant voltage source 35 are derived from the on-chip current source and on-chip voltage source.

Figure 4:
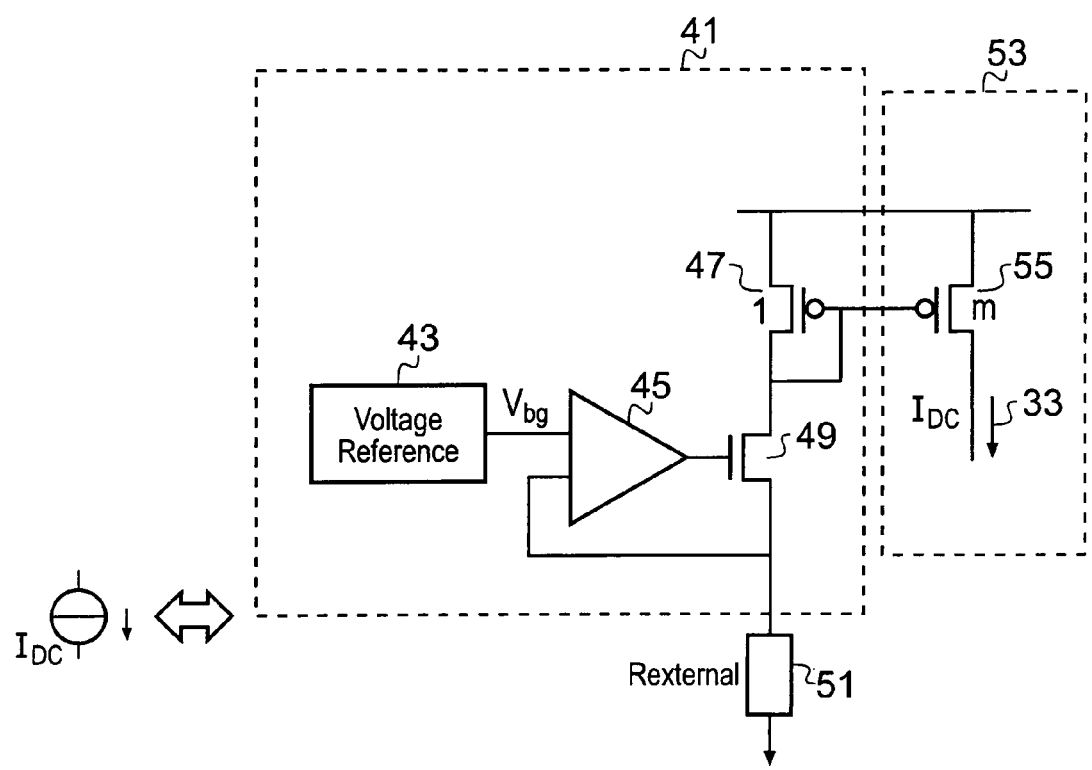
FIG. 4 shows further details of the constant current source shown in the biasing circuit of FIG. 3.

FIG. 4 shows in more detail how the constant current source 33 is derived. The on-chip current source 41 is shown in dotted lines and is generated, for example, using a voltage source 43, an amplifier 45 and transistors 47, 49. The on-chip current source 41 also comprises an external resistor 51 which, being an external component, can be chosen to be accurate to less than 1%, and have a zero temperature coefficient. The resultant current source is therefore largely invariant to, for example, on-chip process and/or temperature variations. The current source is used as a reference for many on-chip circuits as described above.

According to the invention, a circuit 53 is provided for deriving a fraction of the on-chip current source 41, for use in the Gm biasing circuit shown in FIG. 3. Preferably, the circuit 53 comprises a transistor 55. The fraction β of current taken from the on-chip current source 41 is determined by the ratio of the gain of transistor 47 (say "1") in relation to the gain of transistor 55 (say "m"), ie β is defined as the ratio m:1.

The constant current source 33 (or $I_{DC}$) for the constant Gm biasing circuit is therefore defined as:

$$I_{DC} = \beta \cdot V_{bg}/R_{ext}$$

where $V_{bg}$ is the reference or band gap voltage 43 and $R_{ext}$ is the external resistor 51.

As previously mentioned above, it is assumed that the constant current source 33 and its associated external resistor 51 will already be provided on the integrated circuit for other biasing circuits, which means that the constant Gm circuit of the present invention does not require any further external components or extra pins.

Figure 5:
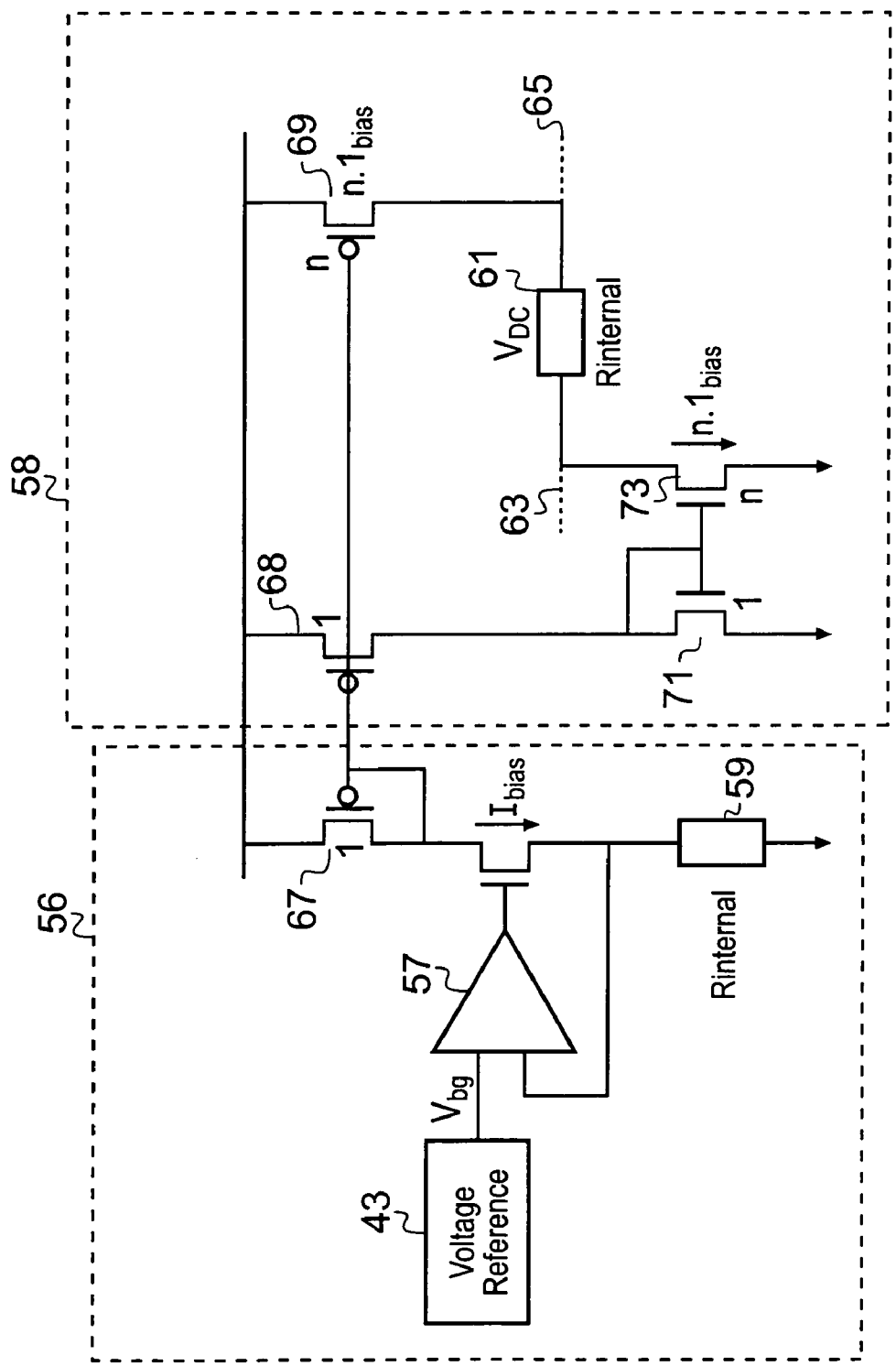
FIG. 5 shows further details of the constant voltage source shown in the biasing circuit of FIG. 1.

FIG. 5 shows in greater detail how the constant voltage source 35 ($V_{DC}$) is preferably derived. The on-chip voltage source 56 is shown in dotted lines, and is already provided on-chip for other purposes as mentioned above, for example fixing the amplitude of ECL logic. It is noted that other circuits could equally be used to provide the on-chip voltage source 56. A voltage reference 43 and an internal resistor 59 are provided to give a process/temperature dependent curve which is then applied to a local resistor 61 of the circuit 58 which is used to derive the fraction of the on-chip voltage source. The local resistor 61 is matched with, but not necessarily equal to, the internal resistor 59. Thus, the current flowing through the matching local resistor 61 cancels out any process or temperature variations. The constant voltage source 5 (or $V_{DC}$) for use in the constant Gm biasing circuit is taken across points 63, 65 in FIG. 5. The constant voltage source 5 ($V_{DC}$) is a fraction a of the original voltage reference $V_{bg}$ ie $V_{DC} = \alpha \cdot V_{bg}$ The faction α is determined by the ratio of the gains of transistors 67, 69, 71, 73 and the ratio of the internal resistors 59, 61, as explained below. First, α is determined by the ratio of the gain of transistor 67 (say "1") in relation to the gain of transistor 69 (say "n"). The ratio of the NMOS transistors 71 and 73 are also set at 1:n so that the current sourced at node 65 by transistor 69 is removed by the NMOS current sink.

Furthermore, by using internal resistors 59, 61 which are of the same type, thus tracking each other over process and temperature, a fraction α of $V_{bg}$ can be generated to provide an absolute bias voltage to the input of the controlled Gm cell within the feedback loop of the control circuit, ($V_{bg}$ being the on-chip band-gap voltage, which is largely independent of process and/or temperature).

Thus, $\alpha = n \cdot R_{61}/R_{59}$, and $$V_{DC} = (n \cdot R_{61} \cdot Vbg)/R_{59}$$

Preferably, the constant-current source 3 and constant-voltage source 5 are derived from the same voltage reference 43. The final controlled transconductance Gm is thereby defined as:

$$Gm = I_{DC}/V_{DC} = \beta/\alpha \cdot 1/R_{ext}$$

This has the advantage that the controlled transconductance is independent of variations or fluctuations in the actual voltage reference 43.

Preferably, the fractions $\alpha$ and $\beta$ for the biasing circuit are determined according to the type of Gm cell being controlled. In other words, the fractions are chosen such that the transconductance is controlled in a linear region of the transconductance curve for the Gm cell being controlled.

$\alpha$ is chosen such that the Gm cell is operating within its linear range with $V_{DC}$ significantly higher that any input offset variations of the Gm cell which would cause errors in the setting of the transconductance.

The value of $\beta$ is then determined from the equation:

$$I_{DC} = \beta \cdot V_{bg}/R_{ext}$$

ie, $\beta = I_{DC} \cdot R_{ext}/V_{bg}$

Figure 6A:
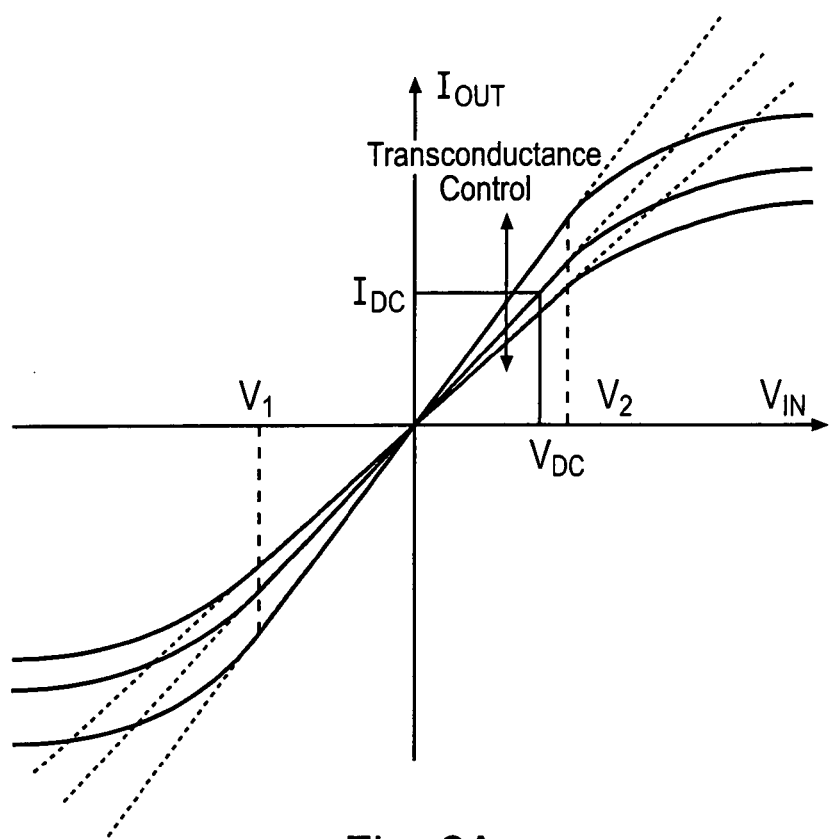
FIG. 6a shows the Gm transfer characteristic with differential input or with single ended input with the quiescent operating point of the Gm cell defined.

FIG. 6a shows the transfer function, $I_{OUT}$ against $V_{IN}$, of a Gm cell with a differential voltage input (or a single ended voltage applied to the quiescent applied voltage). The three curves of the characteristic show the variation of transconductance, defined by the slope, over process and temperature with the controlling element fixed. $V_{DC}$ is the voltage applied at the input of the cell and $I_{DC}$ is the current applied at the output of the cell, which are used to define the transconductance of the cell in its control loop. The transconductance is equal to the slope of the linear region between voltages $V_1$ and $V_2$.

Figure 6B:
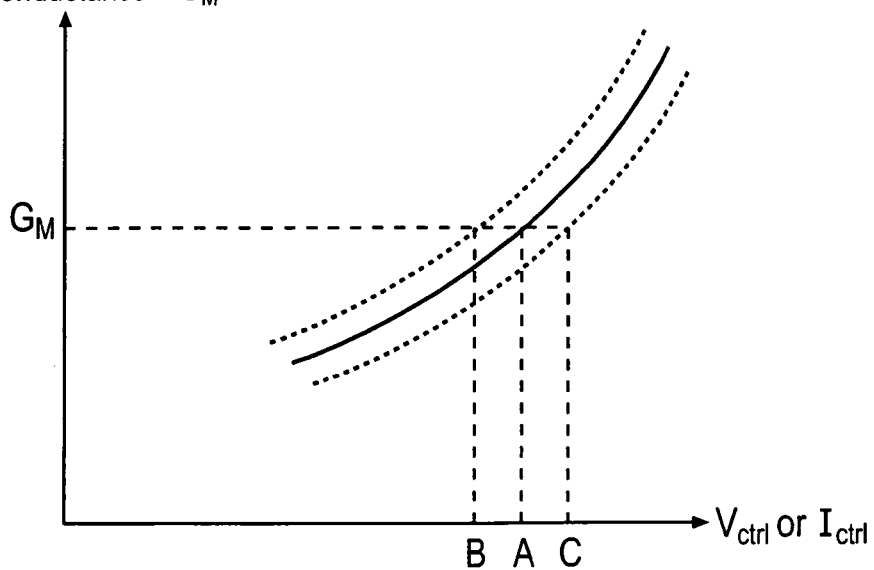
FIG. 6b shows how the transconductance curve is controlled using a control voltage $V_{CNTL}$ or control current $I_{CNTL}$.

FIG. 6b shows how the transconductance can be adjusted by the applied control voltage or current, ie $V_{ctrl}$ or $I_{ctrl}$ depending on the type of Gm cell being controlled (as shown in FIGS. 1 and 2 above). To set the transconductance to the value Gm the control voltage or current would have to be set at values A, B or C for the three curves representing the nominal, and the extremes of process and temperature.

A more detailed explanation of the invention will now be given with reference to a single ended implementation and a differential implementation.

Figure 7:
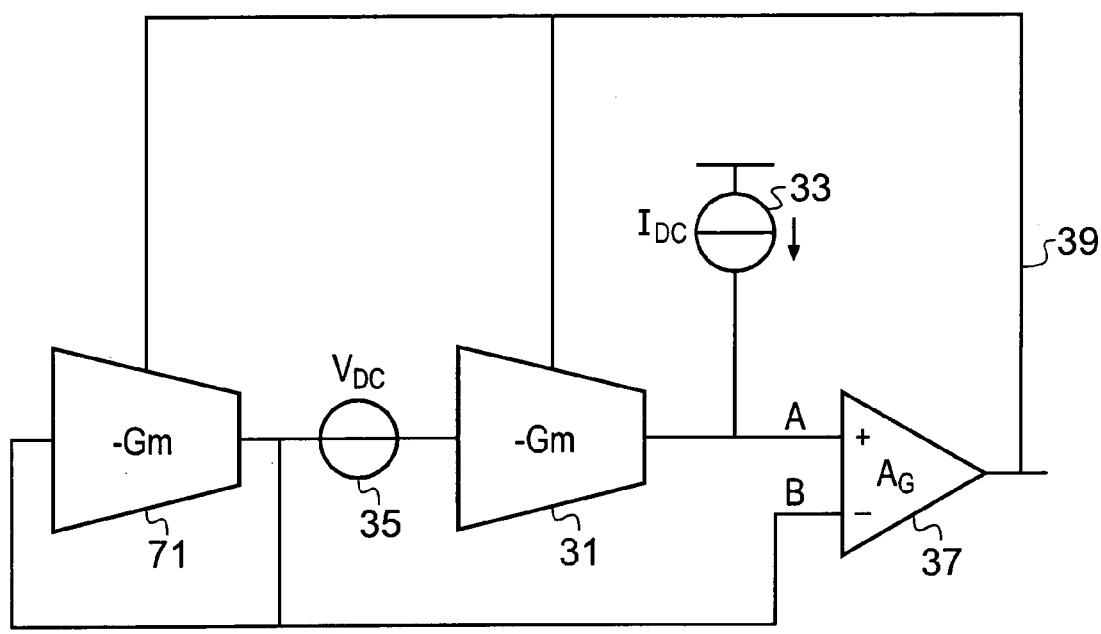
FIG. 7 shows the application of the invention in a single ended implementation.

FIG. 7 shows a single ended implementation of the invention. As mentioned above in relation to FIG. 3, the constant Gm biasing circuit comprises a Gm cell 31 having controllable transconductance, a constant current source 33, a constant voltage source 35 and an amplifier 37 introducing loop gain. The aim of the circuit is to force the transconductance of Gm cell 31 to be $I_{DC}/V_{DC}$. According to this embodiment of a single ended implementation, the biasing circuit comprises a second Gm cell 71. The second Gm cell 71 provides the quiescent DC voltage for the Gm cell 31 being controlled. Alternatively, the dc voltage could be provided using a resistor or other device. The constant transconductance is achieved by providing a control signal 39 to the Gm cells 31 and 71 that keep their transconductance constant over process and temperature, the control signal 39 being either a voltage signal or a current signal, depending on the configuration of the Gm cell.

The second Gm cell 71 is of the same type as the first cell 31 and is connected as an active voltage divider with its output current being fed back to its input. The second Gm cell 71 then provides the common mode operating point (voltage) for the first cell 31. With the second cell 31 arranged in this manner at the input of the first cell 31, no DC current will flow into or out from the output of the first Gm cell 31. The DC voltage at "B" at the input of Gm cell 31 will automatically adjust to maintain a zero current state. The constant voltage source 35 ($V_{DC}$) is provided in series with the voltage at B, which enables the first Gm cell 31 to draw current at its output. Any difference between this current and the applied current 33 produces an error voltage at A, which is amplified by amplifier 37 to produce a control signal 39.

Control signal 39 adjusts the transconductance of both cells 31 and 71 until the voltage at A equals the voltage at B, and the current drawn by cell 31 equals the applied current 33. The transconductance of the first Gm cell 31 is thereby forced to be $I_{DC}/V_{DC}$.

Since the constant current source 33 and constant voltage source 35 are predetermined fractions of the respective on-chip current and voltage sources, the accuracy of the transconductance is determined by the matching accuracies of the on-chip current source and the on-chip voltage source, and the temperature variation of the on-chip current source's external resistor.

The low input offset of the amplifier 37 forces the voltage at A to be equal to B. The control signal 39 can also be used to set the transconductance of other GM cells used elsewhere on-chip, for example, the transconductance amplifiers of GmC-filters, provided that these transconductance amplifiers are identical in design to cell 31. In addition, the control signal 39 can also be used to set the transconductance of other Gm cells used elsewhere on-chip, provided the design of such cells is matched with Gm cell 31 to an accurate predefined ratio. This is particularly relevant in the case of CMOS amplifiers of the type shown in FIG. 1, where multiple gates, say m, would increase the transconductance by the same ratio. If the transconductance amplifier 31 in FIG. 7, for example, has two gate stripes and was set to 50 $\mu S$ by the control loop, then a similar Gm cell in a GmC filter with ten stripes would be controlled to be five times 50 $\mu S$, ie 250 $\mu S$.

Figure 8:
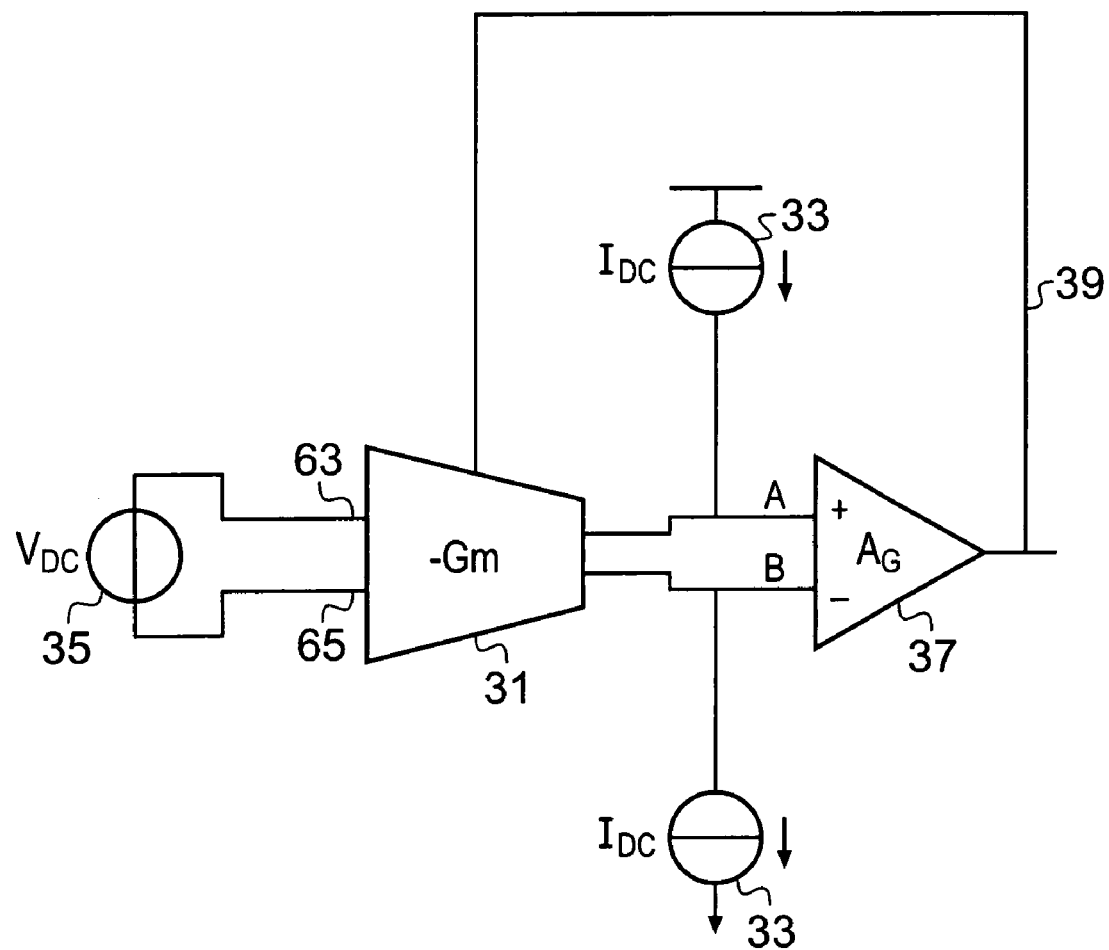
FIG. 8 shows the application of the invention in a differential implementation.

FIG. 8 shows an embodiment of the invention for a differential implementation. The transconductance of cell 31 is forced to be $IDC/V_{DC}$. Additional common mode circuitry, not shown, is used to set the common mode voltage at the input and output of the Gm cell 31. A constant voltage source 35 ($V_{DC}$), i.e. a fraction of the on-chip voltage source, is applied differentially at the input 63, 65 of the Gm cell 31, which enables it to sink/source current at its output. Any deviation of this current from the applied current $I_{DC}$ produces an error voltage A, which is amplified by amplifier 37 to produce a control signal 39. Control signal 39 adjusts the transconductance of cell 31 until the voltage at A equals the voltage at B, and the current drawn by Gm cell 31 equals the applied current 33. The transconductance of the first Gm cell 31 is thereby forced to be $I_{DC}/V_{DC}$.

The differential voltage applied at the input 63, 65 is derived as shown above in relation to FIG. 5. The accuracy of the transconductance is determined by the matching accuracies of the constant current source 33 ($IDC$) and the constant voltage source 35 ($V_{DC}$), and hence the accuracy of the on-chip current source, on-chip voltage source, and the process and/or temperature variation of the external resistor provided for the on-chip current source.

The invention described above provides a control signal to a Gm cell that ideally makes its transconductance constant over process and temperature variations.

The invention enables the transconductance of a Gm cell to be maintained constant using the on-chip voltage source and an on-chip current source and its external resistor, which are already provided on the integrated circuit for other purposes, thereby eliminating the need for any additional external components.

It is noted that the voltages and currents mentioned in the various embodiments can be single ended or differential, depending on implementation.

Although the invention has been described in relation to common Gm cells such as a CMOS inverter and a bipolar differential pair, it is noted that the invention is also applicable to other types of Gm cells.

In addition, although the invention has been described in relation to controlling just one Gm cell, it will be readily appreciated that the invention can be used to control a plurality of Gm cells on an integrated circuit.

Preferably, the filter response can be fine tuned using simple internal logic and switches to fine-tune the current $I_{DC}$ in FIG. 2 and compensate for any changes in the absolute on-chip capacitance due to process variation.

Since the invention makes use of no external frequency reference for Gm-C filters, it is advantageous over other constant Gm biasing schemes that use external frequency references.

The architecture described above can be implemented with CMOS, bipolar, BiCMOS, or other technologies.

What is claimed is:

1. An integrated circuit comprising a biasing circuit for maintaining the transconductance of a Gm cell constant, the integrated circuit comprising an on-chip constant voltage source and an on-chip constant current source, the on-chip constant current source having a connection for an external resistance, the value of the external resistance determining the current generated by the constant current source, characterised in that the biasing circuit comprises:
    means for providing a first fraction of the current generated by the on-chip current source to bias the output of the Gm cell;
    means for providing a second fraction of the voltage generated by the on-chip voltage source to bias the input of the Gm cell; and
    means for controlling the transconductance of the Gm cell to be equal to the ratio of said fraction of the current generated by the on-chip current source to said fraction of the voltage generated by the on-chip voltage source.

2. An integrated circuit as claimed in claim 1, wherein the means for controlling the transconductance comprises a feedback circuit including an amplifier, the amplifier providing a control signal for controlling the transconductance of the Gm cell.

3. An integrated circuit as claimed in claim 2, wherein the control signal is a current signal.

4. An integrated circuit as claimed in claim 2, wherein the control signal is a voltage signal.

5. An integrated circuit as claimed in claim 1, wherein the means for providing the second fraction of the on-chip voltage source comprises first and second transistors, the first and second transistors having a gain ratio of 1:n.

6. An integrated circuit as claimed in claim 5, wherein the gain n of the second transistor is predetermined according to the transconductance characteristics of the Gm cell being controlled.

7. An integrated circuit as claimed in claim 1, wherein the means for providing the first fraction of the on-chip current source comprises a transistor.

8. An integrated circuit as claimed in claim 7, wherein the gain m of the transistor is chosen according to the transconductance characteristics of the Gm cell being controlled.

9. An integrated circuit as claimed in claim 1, wherein the on-chip current source and on-chip voltage source are generated using the same voltage reference, such that the transconductance of the Gm cell is equal to the ratio of the first fraction to the second fraction divided by the value of the external resistor.

10. An integrated circuit as claimed in claim 2, further comprising a second Gm cell, the second Gm cell providing a common mode operating point voltage at the input of the first Gm cell, the second Gm cell also being controlled by the control signal.

11. An integrated circuit as claimed in claim 10, wherein the components forming the second Gm cell are matched with the components forming the first Gm cell.

12. An integrated circuit as claimed in claim 1, wherein the first fraction of the on-chip current source is connected differentially to the output of the Gm cell, and wherein the second fraction of the on-chip voltage source is connected differentially to the input of the Gm cell.

13. An integrated circuit as claimed in claim 2, wherein the control signal is also used to control another Gm cell of the same design on the integrated circuit.

14. An integrated circuit as claimed in claim 2, wherein the control signal is used to control another Gm cell on the integrated circuit, the design characteristics of the other Gm cell having a predefined ratio to the design characteristics of the first Gm cell.

15. A method of maintaining the transconductance of a Gm cell on an integrated circuit constant, the integrated circuit comprising an on-chip constant voltage source and an on-chip constant current source, the on-chip constant current source having a connection for an external resistance, the value of the external resistance determining the current generated by the constant current source, characterised in that the method comprises the steps of:
    providing a first fraction of the current generated by the on-chip current source to bias the output of the Gm cell;
    providing a second fraction of the voltage generated by the on-chip voltage source to bias the input of the Gm cell; and
    controlling the transconductance of the Gm cell to be equal to the ratio of said fraction of the current generated by the on-chip current source to said fraction of the voltage generated by the on-chip voltage source.

16. A method as claimed in claim 15, wherein the step of controlling the transconductance comprises providing a feedback circuit including an amplifier, the amplifier providing a control signal for controlling the transconductance of the Gm cell.

17. A method as claimed in claim 16, wherein the control signal is a current signal.

18. A method as claimed in claim 16, wherein the control signal is a voltage signal.

19. A method as claimed in claim 15, wherein the step of providing the second fraction of the on-chip voltage source comprises providing first and second transistors having a gain ratio of 1:n.

20. A method as claimed in claim 19, further comprising the step of setting the gain n of the transistor according to the transconductance characteristics of the Gm cell being controlled.

21. A method as claimed in claim 15, wherein the step of providing the first fraction of the on-chip current source comprises providing a transistor to generate the first fraction of the on-chip current source.

22. A method as claimed in claim 21, further comprising the step of setting the gain m of the transistor according to the transconductance characteristics of the Gm cell being controlled.

23. A method as claimed in claim 15, wherein the on-chip current source and on-chip voltage source are generated using the same voltage reference, such that the transconductance of the Gm cell is equal to the ratio of the first fraction to the second fraction divided by the value of the external resistor.

24. A method as claimed in claim 16, further comprising the step of providing a second Gm cell, the second Gm cell providing a common mode operating voltage to the input of the first Gm cell, the second Gm cell also being controlled by the control signal.

25. A method as claimed in claim 24, further comprising the step of matching the components forming the second Gm cell with the components forming the first Gm cell.

26. A method as claimed in claim 15, further comprising the step of connecting the first fraction of the on-chip current source differentially to the output of the Gm cell, and connecting the second fraction of the on-chip voltage source differentially to the input of the Gm cell.

27. A method as claimed in claim 16, wherein the control signal is also used to control another Gm cell of the same design on the integrated circuit.

28. A method as claimed in claim 16, wherein the control signal is used to control another Gm cell on the integrated circuit, the design characteristics of the other Gm cell having a predefined ratio to the design characteristics of the first Gm cell.

* * * * *